(12) United States Patent
Kondo

(10) Patent No.: US 10,959,360 B2
(45) Date of Patent: Mar. 23, 2021

(54) WORK APPARATUS AND PRODUCTION LINE

(71) Applicant: FUJI CORPORATION, Chiryu (JP)

(72) Inventor: Masahiro Kondo, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 287 days.

(21) Appl. No.: 16/077,065

(22) PCT Filed: Feb. 17, 2016

(86) PCT No.: PCT/JP2016/054584
§ 371 (c)(1),
(2) Date: Aug. 10, 2018

(87) PCT Pub. No.: WO2017/141377
PCT Pub. Date: Aug. 24, 2017

(65) Prior Publication Data
US 2019/0045680 A1   Feb. 7, 2019

(51) Int. Cl.
*H05K 13/02* (2006.01)
*H05K 13/08* (2006.01)
(Continued)

(52) U.S. Cl.
CPC .......... *H05K 13/021* (2013.01); *B61B 13/12* (2013.01); *H05K 13/02* (2013.01);
(Continued)

(58) Field of Classification Search
CPC .. H05K 13/02; H05K 13/021; H05K 13/0409; H05K 13/08; H05K 13/086; H05K 13/12; H05K 13/0419
See application file for complete search history.

(56) References Cited

U.S. PATENT DOCUMENTS 4,651,863 A * 3/1987 Reuter ................... B65G 1/133
                                                      198/339.1
4,846,620 A * 7/1989 Mims .................. B65G 1/0407
                                                        414/273
(Continued)

FOREIGN PATENT DOCUMENTS

CN        101175681 A    5/2008
CN        104429174 A    3/2015
(Continued)

OTHER PUBLICATIONS

International Search Report dated May 24, 2016, in PCT/JP2016/054584 filed Feb. 17, 2016.

*Primary Examiner* — Carl J Arbes
(74) *Attorney, Agent, or Firm* — Oblon, McClelland, Maier & Neustadt, L.L.P.

(57) ABSTRACT

A work apparatus and a production line that effectively moves a work apparatus at a production line while reducing setup costs. A work apparatus of the production line includes an exchanging device configured to perform collecting and supplying of an exchange element set on each of the multiple electronic component mounters; a first rail provided on a front section of the multiple electronic component mounters, extending in the conveyance direction of the circuit board, and including a planar traveling path; and a moving device configured to move the exchanging device along the first rail by driving a driving wheel configured to engage with the traveling path of the first rail via friction.

8 Claims, 6 Drawing Sheets

(51) Int. Cl.
  *B61B 13/12* (2006.01)
  *H05K 13/04* (2006.01)
(52) U.S. Cl.
  CPC ..... *H05K 13/0409* (2018.08); *H05K 13/0419* (2018.08); *H05K 13/08* (2013.01); *H05K 13/086* (2018.08)

(56) References Cited

U.S. PATENT DOCUMENTS

| | | | | |
|---|---|---|---|---|
| 5,273,392 | A * | 12/1993 | Bernard, II | B65G 1/0485 198/341.04 |
| 5,321,885 | A * | 6/1994 | Hino | B23P 21/004 29/832 |
| 5,380,138 | A * | 1/1995 | Kasai | B23P 19/001 221/134 |
| 5,429,470 | A * | 7/1995 | Nicol | G11B 15/6835 360/92.1 |
| 5,456,001 | A * | 10/1995 | Mori | H05K 13/086 29/739 |
| 5,472,309 | A * | 12/1995 | Bernard, II | B65G 1/0485 414/807 |
| 5,503,516 | A * | 4/1996 | Kasai | B23P 19/001 221/134 |
| 5,692,867 | A * | 12/1997 | Kondo | B23P 19/001 414/268 |
| 5,743,695 | A * | 4/1998 | Ryu | B07C 5/344 414/331.01 |
| 6,272,743 | B1 * | 8/2001 | Nishimori | H05K 13/0061 29/832 |
| 6,572,702 | B1 * | 6/2003 | Freeman | B23P 21/004 118/313 |
| 2012/0110838 | A1 | 5/2012 | Kang | |

FOREIGN PATENT DOCUMENTS

| | | |
|---|---|---|
| DE | 10007898 A1 * | 8/2001 |
| DE | 102006022371 A1 * | 11/2007 |
| EP | 1 894 864 A1 | 3/2008 |
| EP | 2 874 481 A1 | 5/2015 |
| JP | 6-61640 U | 8/1994 |
| JP | 2007-110799 A | 4/2007 |
| WO | WO 2014/010083 A1 | 1/2014 |
| WO | WO 2014/118995 A1 | 8/2014 |
| WO | WO 2014/188520 A1 | 11/2014 |
| WO | WO 2016/013107 A1 | 1/2016 |

* cited by examiner

WORK APPARATUS AND PRODUCTION LINE

TECHNICAL FIELD

The present application relates to a work apparatus and a production line.

BACKGROUND ART

A work apparatus, in a production line configured from multiple electronic component mounters lined up in a conveyance direction of a circuit board, performs specified work with respect to each of the multiple electronic component mounters. For example, disclosed in patent literature 1 is a replenishment device that automatically supplies and collects feeders to and from electronic component mounters as an example of the above specified work. The device of patent literature 1 is configured to move the above replenishment device to a specified position using a rack and pinion mechanism.

CITATION LIST

Patent Literature

Patent literature 1: WO2014/010083

BRIEF SUMMARY

Technical Problem

In the work apparatus configured as above, the engagement state of the rack and pinion affects the movement of the work apparatus. Therefore, for example, when the rack is formed from multiple connected rail members, the multiple rail members must be set maintaining the pitch of the rack teeth at the joins of the rail members. Further, it is necessary for the rack to be formed in a straight line, which increases the cost of setting up the work apparatus.

The present disclosure takes account of such circumstances and an object thereof is to provide a work apparatus and a production line that effectively moves a work apparatus at a production line while reducing setup costs.

Solution to Problem

A work apparatus of the present disclosure is applied to a production line configured from multiple electronic component mounters lined up in a conveyance direction of a circuit board, and performs specified work with respect to each of the multiple electronic component mounters. A work apparatus of the production line includes an exchanging device configured to perform collecting and supplying of an exchange element set on each of the multiple electronic component mounters; a first rail provided on a front section of the multiple electronic component mounters, extending in the conveyance direction of the circuit board, and including a planar traveling path; and a moving device configured to move the exchanging device along the first rail by driving a driving wheel configured to engage with the traveling path of the first rail via friction.

A production line of the present disclosure includes: multiple electronic component mounters lined up in a row in a conveyance direction of a circuit board an exchanging device configured to perform collecting and supplying of an exchange element set on each of the multiple electronic component mounters; a first rail provided on a front section of the multiple electronic component mounters, extending in the conveyance direction of the circuit board, and including a planar traveling path; and a moving device configured to move the exchanging device along the first rail by driving a driving wheel configured to engage with the traveling path of the first rail via friction.

Advantageous Effects

According to a configuration of the present disclosure, an exchanging device is moved in a direction in which electronic component mounters are lined up (a conveyance direction of a circuit board) by the driving of a driving wheel that engages with a first rail via friction. Thus, because the driving wheel engages the planar traveling path of the first rail via friction, the exchanging device can be moved by driving the driving wheel. Also, compared to a moving device with a configuration that uses a rack and pinion for which the rack must be configured with a specified accuracy, the moving device needs only to be configured such that a traveling path is formed on the first rail, with the driving wheel being capable of rolling on the traveling path. Accordingly, setup costs for applying the work apparatus to a production line and setup costs of a production line provided with the exchanging device are reduced.

DESCRIPTION OF EMBODIMENTS

Embodiment

Configuration of Production Line 1

Figure 1:
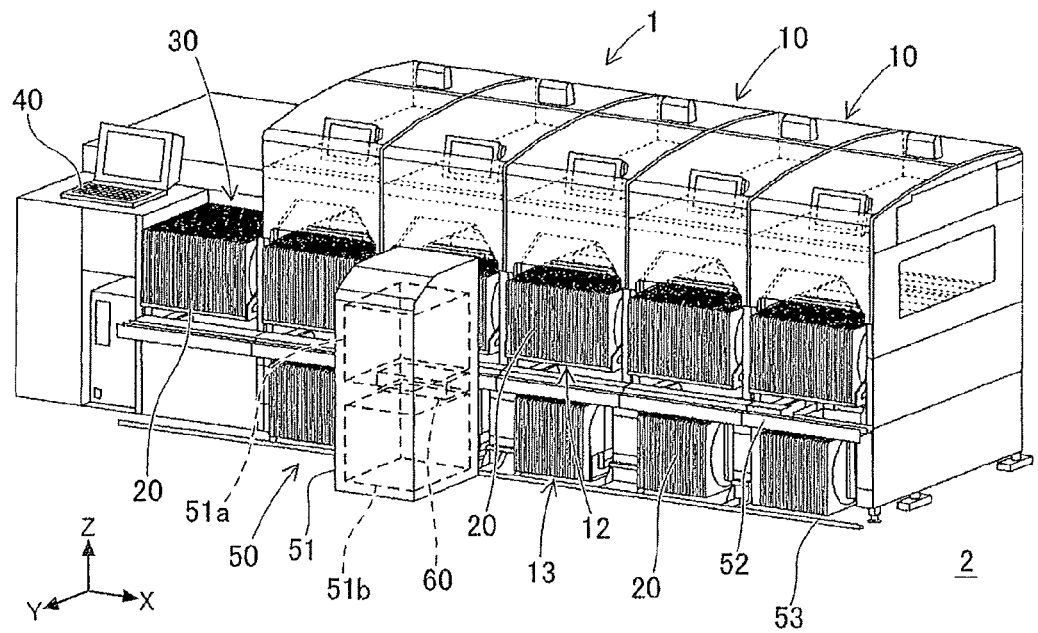
FIG. 1 is a perspective view showing an embodiment in which the work apparatus is applied to a production line.
Figure 2:
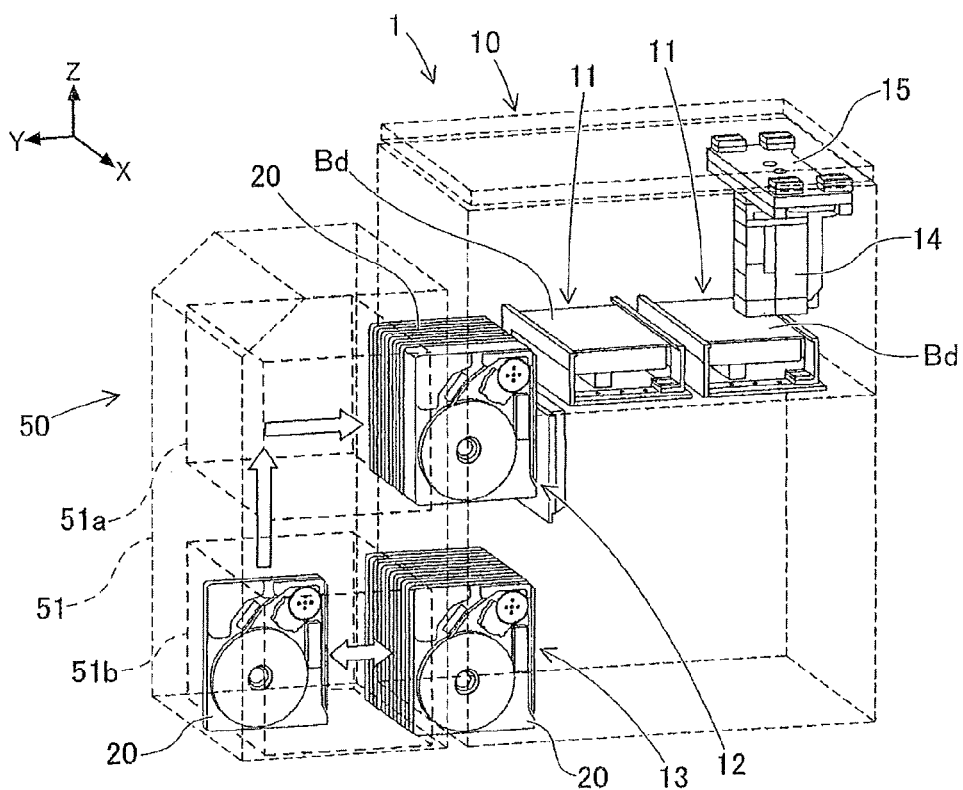
FIG. 2 is a perspective view schematically showing the configuration of the work apparatus and electronic component mounter of FIG. 1.

As shown in FIGS. 1 and 2, production line 1 is configured from multiple electronic component mounters 10 lined up in a row in the conveyance direction (X direction) of circuit board Bd. Feeder storage device 30 used to store cassette-type feeders 20 is provided on the board loading side (upper left side in FIG. 1) of production line 1. Also, machines such as a screen printer, a mounting inspection machine, or a reflow oven may be included in production line 1.

In the present embodiment, exchanging robot 50 is applied as a work apparatus that performs specified work with respect to each of feeder storage device 30 and the multiple electronic component mounters 10. Exchanging robot 50 and the other machines that configure production line 1 are configured to exchange various pieces of data with management device 40 via a network, which is not shown. Details regarding exchanging robot 50 are described later.

Feeder storage device 30 includes multiple slots and stocks feeders 20 set in those slots. When a feeder 20 is set in feeder storage device 30, communication is possible between feeder 20 and management device 40. Accordingly, identification codes (IDs) are allocated to slots of feeder storage device 30 and to feeders 20 set in those slots and memorized in management device 40.

Management device 40 monitors the operating state of production line 1, and performs control of production equipment including electronic component mounters 10 and feeder storage device 30. Various types of data for controlling electronic component mounters 10 are stored in management device 40. Management device 40, when performing production processing for each item of production equipment, sends various data such as a control program to each item of production equipment as appropriate.

Configuration of Electronic Component Mounter 10

As shown in FIG. 2, the multiple electronic component mounters 10 that configure production line 1 include: board conveyance device 11, upper section slots 12, lower section slots 11, mounting head 14, and head moving device 15. In the descriptions below the horizontal width direction of electronic component mounters 10, that is, the conveyance direction of circuit board Bd is the X direction, the horizontal depth direction of the electronic component mounters 10 is the Y direction, and the vertical direction perpendicular to the X direction and the Y direction is the Z direction (vertical direction of FIG. 1).

Board conveyance device 11 is configured from a belt conveyor or the like and consecutively conveys circuit boards Bd in a conveyance direction. Board conveyance device 11 positions circuit board Bd at a specified position inside electronic component mounter 10. Then, after mounting processing has been performed by electronic component mounter 10, board conveyance device 11 unloads circuit board Bd from electronic component mounter 10.

Upper section slots 12 are arranged in an upper section of the front side of electronic component mounter 10 and support set feeders 20 such that operation is possible. That is, feeders 20 set in upper section slots 12 have operation controlled during mounting processing of mounting electronic components using electronic component mounter 10 such that electronic components are supplied to a removal section provided at a specified position of an upper section of the feeder.

Lower section slots 13 arranged below upper section slots 12 and stock set feeders 20. That is, lower section slots 13 stock as spare feeders 20 to be used in production and temporarily stock feeders 20 that have been used in production. Note that, exchanging of feeders 20 to and from upper section slots 12 and lower section slots 13 may be performed automatically via exchanging robot 50, which is described later, or by manual exchange by an operator.

Mounting head 14 is provided with a holding member (not shown) that holds an electronic component supplied from feeder 20. The above holding member may be, for example, a suction nozzle that holds an electronic component via the supply of negative pressure, or a chuck that holds an electronic component by gripping. Mounting head 14 holds the holding member to be movable in the Z direction and rotatable around a Z axis. Head moving device 15 moves mounting head 14 in the XY directions via a linear drive mechanism.

Electronic component mounter 10 configured as described above controls operation of mounting head 14, head moving device 15, and feeders 20 via a control device, which is not shown. Also, electronic component mounter 10 performs mounting processing of mounting electronic components so as to transfer electronic components supplied from feeders 20 onto specified positions of circuit board Bd.

Configuration of Feeder 20

Figure 3:
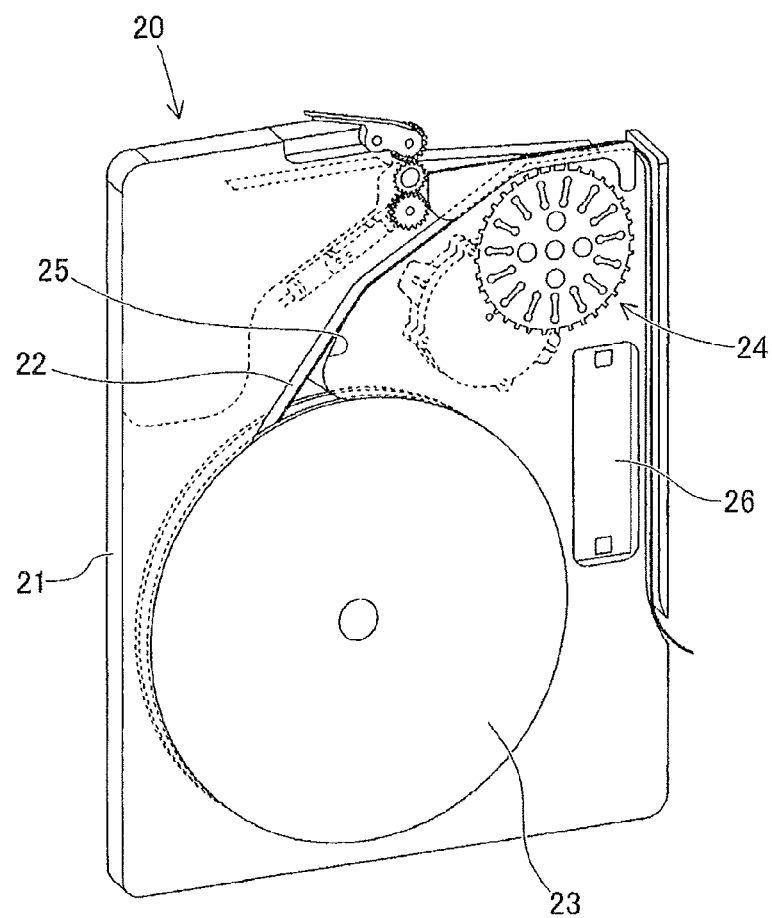
FIG. 3 is a perspective view schematically showing the configuration of a feeder.

The configuration of feeder 20 is described with reference to FIG. 3. As shown in FIG. 3, feeder 20 includes case 21, carrier tape 22, tape reel 23, tape feeding mechanism 24, reel 25, and feeder control device 26. Case 21 is formed substantially as a flat box. Case 21 has a portion that can open and close. Case 21 removably (exchangeably) holds a tape reel 23 on which is wound carrier tape 22.

Carrier tape 22 stores electronic components in storage sections formed in a central section in the width direction. Also, carrier tape 22 includes feeding holes formed at one edge in the width direction. The above storage sections and feeding holes are formed at regular intervals in the feeding direction of carrier tape 22. Cover tape is attached to the upper surface of carrier tape 22 so as to cover the openings of the storage sections. Tape reel 23 is supported to be rotatable with respect to case 21.

Case feeding mechanism 24 rotates a sprocket that engages with the feeding holes of carrier tape 22. Accordingly, tape feeding mechanism 24 pitch feeds carrier tape 22 pulled from tape reel 23 to a removal section provided at a specified position on a top section of feeder 20. Rail 25 supports carrier tape 22 pulled from tape reel 23.

Feeder control device 26, when feeder 20 is set on an upper section slot 12 of electronic component mounter 10, supplies power from the electronic component mounter 10 via a connector. Thus, feeder control device 26 is in a state in which communication with the electronic component mounter 10 is possible. Feeder control device 26 controls operation of tape feeding mechanism 24 based on control commands or the like from electronic component mounter 10.

Feeder 20 configured as described above, when tape feeding mechanism 24 pitch feeds carrier tape 22, peels the cover tape at a position forward of the removal section of the electronic component so as to reveal the electronic component and allow it to be removed. In this manner, electronic components loaded in feeder 20 are supplied so as to be picked up by the holding member of mounting head 14 at the removal section on the top section of feeder 20.

Configuration of Exchanging Robot 50

Exchanging robot 50, with respect exchanging elements that are feeders 20 that supply electronic components to be mounted on circuit board Bd, performs collecting and supplying of the feeders 20 between multiple electronic components 10 that configure production line 1, and between feeder storage sections 30. More specifically, exchanging robot 50 conveys a feeder 20 to be used in production of a circuit board product from feeder storage device 30 to a lower section slot 13 or an upper section slot 12 of an electronic component mounter 10. Further, exchanging robot 50 exchanges a feeder 20 between the upper section slots 12 and the lower section slots 13 of the electronic component mounters 10. Also, exchanging robot 50 conveys used feeders 20 from electronic component mounter 10 to feeder storage device 30.

Figure 4:
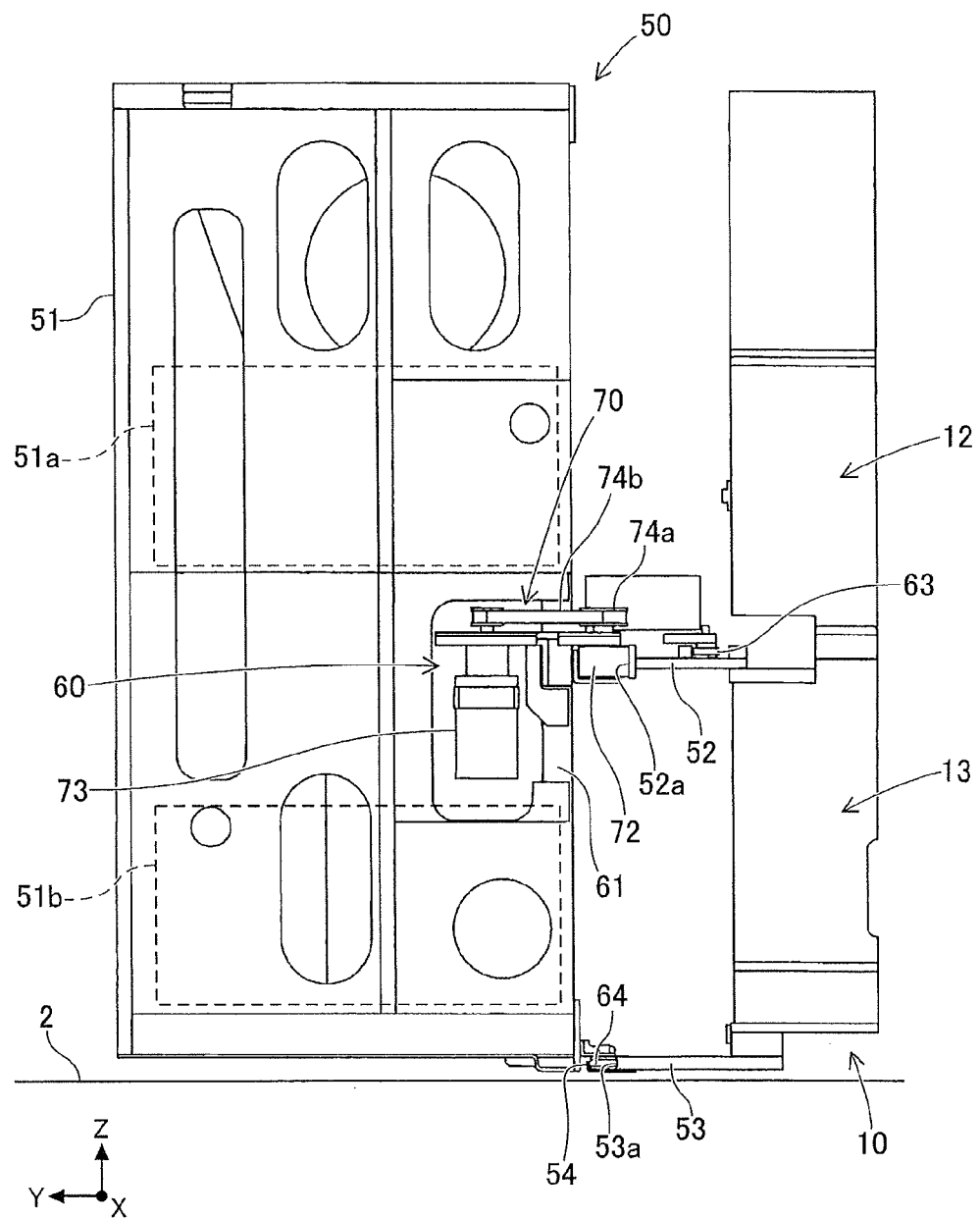
FIG. 4 is a side view showing the work apparatus of FIG. 1.
Figure 5:
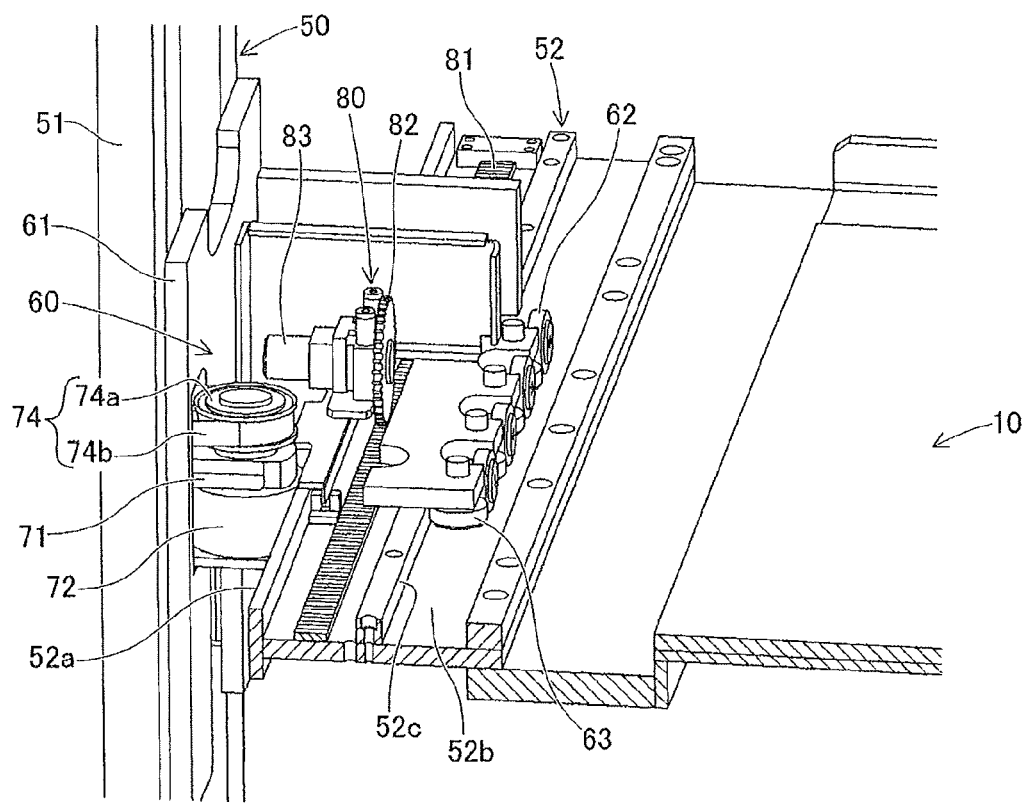
FIG. 5 is a perspective view showing the configuration of a moving device of the work apparatus of FIG. 4.

As shown in FIG. 4, exchanging robot 50 is provided with exchanging device 51, first rail 52, second rail 53, separation prevention guide 54, moving device 60, and position detecting device 80 (refer to FIG. 5). Exchanging device 51 performs collecting and supplying of feeders 20 set on each of the multiple electronic component mounters 10. In detail, exchanging device 51 is provided with a moving mechanism that moves a clamp (not shown) that grips a feeder 20 in the Y direction and the Z direction.

As shown in FIG. 4, exchanging device 51 includes upper section transfer section 51*a* that transfers feeders 20 to be exchanged to and from upper section slots 12, and lower section transfer section 51*b* that transfers feeders 20 to be exchanged to and from lower section slots 13. Exchanging device 51 controls the gripping state and YZ-direction position of the above clamp at upper section transfer section 51*a* and lower section transfer section 51*b* based on control commands from electronic component mounter 10 or management device 40.

As shown in FIG. 1, first rail 52 is provided on a front section of the multiple electronic component mounters 10. In more detail, first rail 52 is provided between the upper section slots 12 and the lower section slots 13 in the vertical direction on each of the multiple electronic component mounters 10. Note that, in the present embodiment, first rail 52 is configured such that individual rail members of the same shape are connected in the X direction on each of the multiple electronic component mounters 10 and feeder storage devices 30. Adjacent rail members are arranged in a substantially straight line and may be arranged with a slight gap in the XYZ directions at the joins.

Figure 6:
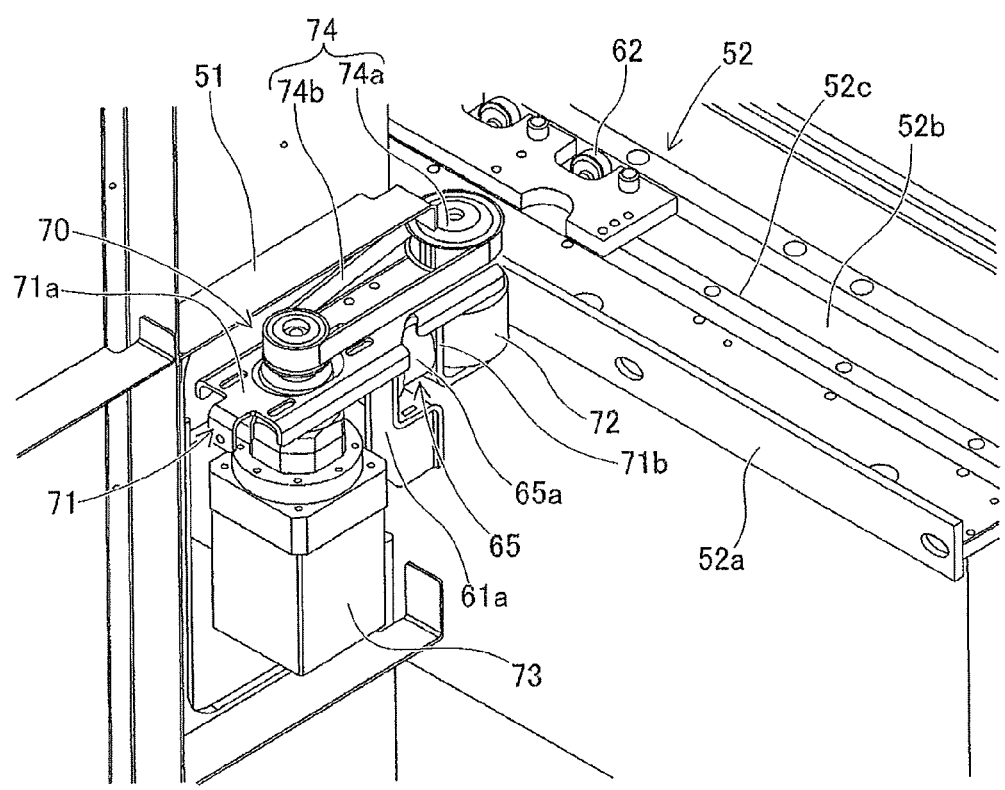
FIG. 6 is a perspective view showing the inside configuration of the moving device of the work apparatus of FIG. 4.

Also, as shown in FIGS. 5 and 6, first rail 52 includes planar traveling path 52*a* that extends in the conveyance direction (X direction) of the circuit board. In the present embodiment, traveling path 52*a* is formed perpendicular to a horizontal plane (XY plane) and facing exchanging device 51. Traveling path 52*a* of first rail 52 engages with driving wheel 72, which is described later, via friction. Therefore, traveling path 52*a*, so long as the overall form is planar, may be configured, for example, with a slit or recess or protrusion for preventing driving wheel 72 from rotating idly. Also, further formed on first rail 52 may be upper surface section 52*b* parallel to the horizontal plane, and side surface section 52*c* perpendicular with respect to upper surface section 52*b* and facing the opposite side to exchanging device 51.

Second rail 53 is provided on the front section of the multiple electronic component mounters 10 at a different vertical position to first rail 52. In the present embodiment, as shown in FIG. 4, second rail 53 is provided below first rail 52 and lower section slots 13 of electronic component mounters 10. Second rail 53 extends in the conveyance direction (X direction) of circuit board Bd, is perpendicular with respect to the horizontal plane (XY plane), and is formed with support section 53*a* facing the exchanging device 51 side.

Support section 53*a* of second rail 53 supports third guide roller 64, which is described later, in a rotatable manner. Separation prevention guide 54 includes a facing surface that faces support section 53*a* and prevents third guide roller 64 that rolls along support section 53*a* of second rail 53 from separating from support section 53*a*. Accordingly, separation prevention guide 54, when an external force acts to cause exchanging device 51 overall to tilt, contacts third guide roller 64 and curtails the tilting of exchanging device 51.

First rail 52 and second rail 53 configured as described above are provided along the entire length of production line 1 in the X direction. That is, first rail 52 and second rail 53 extend from the circuit board Bd loading side to feeder storage device 30. Thus, exchanging device 51, by operation of moving device 60, which is described later, is configured to be able to move to any position in the X direction including anywhere on the front side of the multiple electronic component mounters 10 and the feeder storage device 30.

Moving device 60 engages driving wheel 72 of driving unit 70, which is described later, with traveling path 52*a* of first rail 52 via friction, and moves exchanging device 51 along first rail 52 by driving a driving wheel 72. As shown in FIGS. 4 to 6, moving device 60 includes main body section 61, first guide roller 62, second guide roller 63, third guide roller 64, biasing mechanism 65, and driving unit 70. Main body unit 61 of moving device 60 is a frame member that holds exchanging device 51. Also, bracket 61*a* for attaching driving unit 70 is formed on main body unit 61.

As shown in FIG. 5, first guide roller 62 engages in a rollable manner with upper surface section 52*b* of first rail 52. Thus, first guide roller 62 regulates downwards movement of exchanging device 51 held by main body section 61. Second guide roller 63 engages in a rollable manner with side surface section 52*c* of first rail 52. By this, second guide roller 63 regulates movement of exchanging device 51 in a horizontal direction (Y direction) perpendicular to the conveyance direction of circuit board Bd. In the present embodiment, multiple first guide rollers 62 and multiple second guide rollers 63 are arranged alternately in the X direction.

As shown in FIG. 4, third guide roller 64 rolls along support section 53*a* of second rail 53. By this, third guide roller 64 maintains the posture of exchanging device 51. Here, when first guide roller 62 and second guide roller 63 support exchanging device 51 engaged by first guide roller 62, due to the relationship between the support position and the center of gravity of exchanging device 51, a moment arises at exchanging device 51 that rotates exchanging device 51 around an axis line parallel to the X axis. Specifically, a force occurs that makes the lower section of exchanging device 51 approach the second rail 53 side.

With respect to this, by third guide roller 64 that can rotate around an axis line parallel to the Z axis contacting second rail 53 at the lower section of exchanging device 51, the posture of exchanging device 51 is maintained against this moment. In this manner, because exchanging device 51 is supported in three directions by three types of guide rollers, an upright posture not contacting floor surface 2 is maintained.

As shown in FIG. 6, driving unit 70 is configured from base plate 71, driving wheel 72, driving motor 73, and transmission mechanism 74. With base plate 71, plate section 71*a* that extends in the Y direction is attached to bracket 61*a* of main body section 61 to be slidable in the Y direction. Also, flange section 71*b* that extends down from the lower surface of plate section 71*a* is formed on base plate 71.

As shown in FIG. 4, driving wheel 72 is provided between upper section transfer section 51*a* of exchanging device 51 and lower section transfer section 51*b* in the vertical direction. Also, as shown in FIG. 6, driving wheel 72 is attached to base plate 71 to be rotatable around an axis line parallel to the Z axis. An external section of driving wheel 72 is formed from a rubbery elastic material such as urethane. Driving wheel 72 engages with traveling 52*a* according to a specified friction force by being biased towards traveling path 52*a* of metal first rail 52. By this, driving wheel 72 is configured such that driving force can be transmitted to traveling path 52*a*. Electric power is supplied to driving motor 73, which outputs a driving force. In the present embodiment, driving motor 73 is supported on base plate 71 such that the driving axis is parallel to the Z axis.

Transmission device 74 transmits driving power output by driving motor 73 to driving wheel 72. In the present embodiment, transmission device 74 is a belt-type device configured from pulley 74a arranged coaxially with driving wheel 72 and that rotates together with driving wheel 72, and endless belt 74b hung between an output shat of driving motor 73 and pulley 74a. Transmission mechanism 74 transmits driving force to driving wheel 72 after reducing the rotation speed of driving motor 73.

Biasing mechanism 65 biases driving wheel 72 towards traveling path 52a such that they are engaged via friction. Here, driving wheel 72 is integrated in a unit with driving motor 73 provided on base plate 71 and transmission mechanism 74 that transmits the driving force. That is, driving unit 70 is configured to be slid as one body in the Y direction with respect to main body section 61. Here, in the present embodiment, biasing mechanism 65 is configured to bias driving wheel 72 against traveling path 52a by pushing driving unit 70 to the first rail 52 side with respect to main body section 61 by the elastic force of spring 65a.

Spring 65a of biasing mechanism 65 is arranged in a compressed state between bracket 61a of main body section 61 and flange section 71b of base plate 71. By this, driving unit 70 is in a state always pushed to the traveling path 52a side in the Y direction with respect to main body section 61. In this manner, with biasing mechanism 65, even if there is a level difference or a gap at the join of adjacent rail members that configure first rail 52, driving wheel 72 is maintained in a state contacting traveling path 52a of first rail 52. Also, moving device 60 drives driving wheel 72 that engages with traveling path 52a of first rail 52 via friction so as to move exchanging device 51 along first rail 52.

Figure 7:
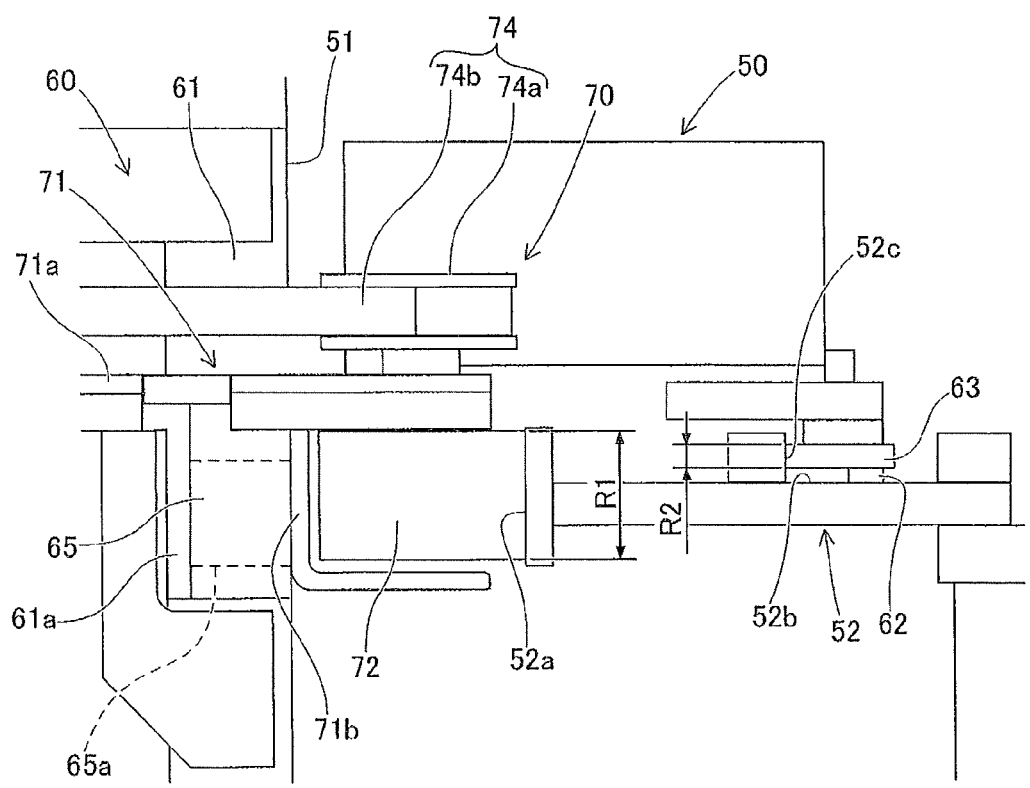
FIG. 7 is an enlarged side view of the driving unit and the first rail shown in FIG. 4.

Also, as shown in FIG. 7, first range R1 in the vertical direction in which driving wheel 72 engages with traveling path 52a of first rail 52 and second range R2 in the vertical direction in which second guide roller 63 engages with side surface section 52c overlap. In the present embodiment, first range R1 is set to include second range R2. According to such a configuration, driving wheel 72 of moving device 60 is positioned to sandwich first rail 52 between driving wheel 72 and second guide roller 63. That is, second range R2 in which second guide roller 63 regulates movement in the Y direction of exchanging device 51 faces first range R1 in which driving wheel 72 transmits driving force to first rail 52. By this, the biasing of driving wheel 72 via biasing mechanism 65 is stable.

As shown in FIG. 5, position detecting device 80 includes toothed belt 81, pinion 82, and rotary encoder 83. Toothed belt 81 is formed of a rubbery elastic material and is provided in the X direction along first rail 52. Pinion 82 is provided on main body section 61 of moving device 60 to be rotatable around an axis line parallel to the Y axis. Pinion 82 is held such that an engaged state with teeth of toothed belt 81 is maintained. Rotary encoder 83 is a rotation angle sensor that detects a rotation angle of pinion 82.

Position detecting device 80 detects the position in the X direction of exchanging device 51 and moving device 60 in production line 1 based on the output pulses of rotary encoder 83. By this, the control device (not shown) of exchanging robot 50 controls operation of moving device 60 so as to move exchanging device 51 to a position in the X direction in accordance with control commands, based on the current position of exchanging device 51 and control commands issued by electronic component mounter 10 or management device 40.

Effects of Embodiment

A work apparatus (exchanging robot 50) of production line 1 is applied to production line 1 configured from multiple electronic component mounters 10 lined up in a conveyance direction of a circuit board Bd, and performs specified work with respect to each of the multiple electronic component mounters 10. The work apparatus (exchanging robot 50) includes exchanging device 51 configured to perform collecting and supplying of an exchange element (feeder 20) set on each of the multiple electronic component mounters 10; first rail 52 provided on a front section of the multiple electronic component mounters 10, extending in the conveyance direction of the circuit board Bd, and including planar traveling path 52a; and moving device 60 configured to move exchanging device 51 along first rail 52 by driving a driving wheel 72 configured to engage with traveling path 52a of first rail 52 via friction.

Production line 1 includes: multiple electronic component mounters 10 lined up in a row in a conveyance direction of circuit board Bd; exchanging device 51 configured to perform collecting and supplying of an exchange element (feeder 20) set on each of the multiple electronic component mounters 10; first rail 52 provided on a front section of the multiple electronic component mounters 10, extending in the conveyance direction of the circuit board Bd, and including planar traveling path 52a; and moving device 60 configured to move exchanging device 51 along first rail 52 by driving a driving wheel 72 configured to engage with traveling path 52a of first rail 52 via friction.

According to such a configuration, exchanging device 51 is moved in a direction in which the electronic component mounters 10 are lined up (the conveyance direction of circuit board Bd) by the driving of driving wheel 72 that engages with first rail 52 via friction. Thus, because driving wheel 72 engages planar traveling path 52a of first rail 52 via friction, exchanging device 51 can be moved by driving a driving wheel 72. Also, compared to a moving device with a configuration that uses a rack and pinion for which the rack must be configured with a specified accuracy, moving device 60 of the present embodiment needs only to be configured such that traveling path 52a is formed on first rail 52, with driving wheel 72 being capable of rolling on traveling path 52a. Accordingly, setup costs for applying exchanging robot 50 to production line 1 and setup costs of production line 1 provided with exchanging device 51 are reduced. In detail, when a rack and pinion mechanism is used in the moving device, if the rack is formed from multiple connected rail members, the multiple rail members must be set maintaining the pitch of the rack teeth at the join of the rail members. Therefore, restrictions arise in the positional relationship of adjacent electronic component mounters 10. In contrast, with the present embodiment, it is sufficient that planar traveling path 52a is formed on first rail 52 such that driving wheel 72 is capable of traveling by being engaged via friction. Thus, compared to a configuration in which rack teeth are formed in a straight line, manufacturing costs of first rail 52 are reduced. Further, because there is no engaging of metal teeth as with a rack and pinion mechanism, noise when traveling is reduced.

Also, traveling path 52a is formed perpendicular to a horizontal plane and facing exchanging device 51. Moving device 60 includes biasing mechanism 65 that biases driving wheel 72 towards traveling path 52a such that they are engaged via friction. According to such a configuration, driving wheel 72 of moving device 60 is maintained in a favorable state biased towards traveling path 52a of first rail 52 by biasing mechanism 65 so as to be engaged with traveling path 52a via friction. By this, because the driving force is transmitted to first rail 52 via driving wheel 72, driving wheel 72 is prevented from rotating idly and traveling ability of moving device 60 is improved. Also, even if there is a gap or level difference between adjacent first rails 52, because driving wheel 72 is appropriately moved by biasing mechanism 65, design tolerances or the like of first rail 52 are absorbed, and favorable traveling is maintained. Thus, freedom in the setup position of the multiple electronic component mounters 10 is improved and setup costs for production line 1 are reduced.

Also, moving device 60 includes main body section 61 that holds exchanging device 51 and driving unit 70 configured from driving wheel 72, driving motor 73, and transmission mechanism 74 that transmits driving force output by driving motor 73 to driving wheel 72. Biasing mechanism 65 biases driving wheel 72 towards traveling path 52a by pushing driving unit 70 to the first rail 52 side with respect to main body section 61. According to such a configuration, driving wheel 72 of moving device 60 is configured to be integrated as one with driving motor 73 and transmission mechanism 74, and is slidable in the Y direction with respect to main body section 61. By this, the driving force is reliably transmitted to driving wheel 72 and driving wheel 72 is engaged with traveling path 52a via friction. Thus, driving wheel 72 is reliably prevented from rotating idly and traveling ability of moving device 60 is improved.

Also, further formed on first rail 52 is upper surface section 52b parallel to the horizontal plane, and side surface section 52c perpendicular with respect to upper surface section 52b and facing the opposite side to exchanging device 51. Moving device 60 also includes first guide roller 62 rotatably engaged with upper surface section 52b of first rail 52 and configured to regulate movement downwards of exchanging device 51, and second guide roller 63 rotatably engaged with the side surface section 52c of first rail 52 and configured to regulate movement of exchanging device 51 in a horizontal direction that is perpendicular to the conveyance direction of circuit board Bd. According to such a configuration, exchanging device 51 is in a state engaged with first rail 52 of electronic component mounter 10 via first guide roller 62 and second guide roller 63 of moving device 60. For example, when a rail is set on floor surface 2 on which electronic component mounter 10 is set, the rail must be fixed in accordance with any unevenness in floor surface 2. With respect to this point, in the above configuration, because exchanging device 51 is in a state not contacting floor surface 2, exchanging robot 50 can be set up regardless of the state of floor surface 2. Accordingly, set up costs for setting up exchanging robot 50 at production line 1 are reduced. Further, first guide roller 62 and second guide roller 63 function as supporting rollers that support exchanging device 51. By this, because a load is not applied to driving wheel 72 of moving device 60 in accordance with the supporting of exchanging device 51, it is possible to make driving unit 70 and biasing mechanism 65 dedicated for moving, such that driving unit 70 and biasing mechanism 65 can be made compact. Accordingly, exchanging robot 50 overall can be made compact.

Also, a range (first range R1) in the vertical direction in which driving wheel 72 engages with traveling path 52a and a second range (second range R2) in the vertical direction in which second guide roller 63 engages with side surface section 52c overlap. According to such a configuration, driving wheel 72 of moving device 60 is positioned to sandwich first rail 52 between driving wheel 72 and second guide roller 63. That is, second range R2 in which second guide roller 63 regulates movement in the V direction of exchanging device 51 faces first range R1 in which driving wheel 72 transmits driving force to first rail 52. By this, the biasing of the driving force by biasing mechanism 65 is stable. Accordingly, operation during work and movement of exchanging device 51 is stabilized.

Also, the work apparatus (exchanging robot 50) is further provided with second rail 53 provided on the front section of the multiple electronic component mounters 10 at a different vertical direction position than first rail 52, extending in the conveyance direction of circuit board Bd, and formed with support section 53a configured to be perpendicular with respect to the horizontal plane and facing exchanging device 51. Moving device 60 also includes third guide roller 64 that rolls along support section 53a of second rail 53 and maintains the posture of exchanging device 51. According to such a configuration, the posture of exchanging device 51 is maintained by third guide roller 64 of moving device 60. Here, depending on the positions of first guide roller 62 and second guide roller 63 in moving device 60, a moment arises acting to rotate exchanging device 51 and moving device 60 around an axis parallel to the conveyance direction (X direction) of circuit board Bd. With respect to this, by providing third guide roller 64 rotatably along second rail 53, exchanging device 51 is supported against this moment. In this manner, the posture of exchanging device 51 supported from three directions is stable, and operation during work or movement of exchanging device 51 is stabilized.

Also, the exchange element is feeder 20 that supplies electronic components to be mounted on circuit board Bd. Exchanging device 51 performs collecting and supplying of feeders 20 between each of the multiple electronic component mounters 10. According to such a configuration, the work apparatus is exchanging robot 50 that performs exchanging work of feeders 20 between electronic component mounters 10. A feeder 20 must be set at an upper section slot 12 or a lower section slot 13 appropriately in accordance with mounting processing of the electronic components. Also, if a component runs out during mounting processing, the progress of mounting processing may be delayed and the cycle time increased. Thus, by feeders 20 being automatically exchanged by the exchanging robot, it is possible to accurately set feeders 20, and to prevent components from running out. Thus, the work apparatus is particular effective when applied to an exchanging robot for feeders 20.

Also, upper section slots 12 that hold set feeders 24 such that operation is possible, and lower section slots 13 provided below upper section slots 12 and that stock set feeders 20 are each provided on the multiple electronic component mounters 10. First rail 52 is provided between the upper section slots 12 and the lower section slots 13 in the vertical direction on each of the multiple electronic component mounters 10. Exchanging device 51 includes upper section transfer section 51a that transfers feeders 20 to be exchanged to and from upper section slots 12, and lower section transfer section 51b that transfer feeders 20 to be exchanged to and from lower section slots 13. Driving wheel 72 is provided between upper section transfer section 51a and lower section transfer section 51b in the vertical direction. According to such a configuration, driving wheel 72 of moving device 60 engages via friction with traveling path 52a of first rail 52 provided between upper section slots 12 and lower section slots 13 of electronic component mounters 10 in the vertical direction. By this, driving unit 70 and biasing mechanism 65 are arranged between upper section transfer section 51a and lower section transfer section 51b and exchanging device 51 for feeders 20 can be made compact. Also, because driving wheel 72 engages with traveling path 52a of first rail 52 between the upper section and lower section of the work apparatus, it is possible to favorably support exchanging device 51 and the posture of exchanging device 51 can be kept more stable.

Alternative Embodiment

Driving Wheel 72

In the embodiment above, moving device 60 is configured with a single driving wheel 72. In contrast, moving device 60 may be configured with multiple driving wheels 72 arranged in a line at different positions in the X direction. Also, the outermost section of driving wheel 72 is formed of an elastic material such as urethane or rubber. With respect to this, driving wheel 72 may be formed from various materials so long as the configuration allows engaging via friction without engaging teeth with traveling path 52a of first rail 52. However, from the point of view of preventing driving wheel 72 from rotating idly, the above embodiment is favorable.

Also, traveling path 52a with which driving wheel 72 engages is configured to be perpendicular to a horizontal plane. However, so long as the configuration is such that driving wheel 72 can engage with traveling path 52a via friction, traveling path 52a may form a horizontal plane in the X direction or a tilted plane, with driving wheel 72 being driven engaging with the traveling path 52a via friction. The same effects are achieved with such a configuration as with the configuration of the first embodiment.

Moving Device 60

In the first embodiment, moving device 60 includes driving unit 70 in which driving wheel 72 and the like are integrated. Driving unit 70, as well as including transmission mechanism 74, may be configured such that the output axis of driving motor 73 is arranged coaxially with the rotation axis of driving wheel 72. Also, moving device 60 may be configured such that driving motor 73 is fixed to the bracket 61a side of main body section 61, and such that driving wheel 72 is movable in the Y direction relative to driving motor 73.

Also, first guide roller 62 and second guide roller 63 are arranged adjacently to each other to be rotatably engaged with upper surface section 52b and side surface section 52c formed on first rail 52. In contrast, first guide roller 62 and second guide roller 63 may be configured to be arranged separated from each other in the Y direction or the Z direction. However, from the viewpoint of making first rail 52 and moving device 60 compact, as in the first embodiment, it is favorable to have a configuration in which first guide roller 62 and second guide roller 63 are arranged close to each other.

The third guide roller of moving device 60 is arranged at a position in the Z direction corresponding to supporting section 53a of third rail 53 provided below first rail 52. In contrast, for example, second guide roller 63 may be arranged above upper section slots 12 of electronic component mounter 10 and first rail 52 and third guide roller 64 may be configured to be arranged at a position in the Z direction corresponding to supporting section 53a of the second rail 53. The same effects are achieved with such a configuration as with the configuration of the first embodiment.

Exchanging Device

In the first embodiment, the exchange element that is the exchange target for exchanging robot 50 is feeder 20 that is set on electronic component mounter 10 and that supplies electronic components to be mounted on circuit board Bd. In contrast, exchanging robot 50 that is the work apparatus may be applied to an exchange element other than feeder 20. Specifically, for example, a nozzle station or a waste tape collection container exchangeably set on electronic component mounter 10 may be the exchange element.

The above nozzle station may be set at a specified position inside electronic component mounter 10 and may hold suction nozzles to be automatically exchanged by mounting head 14. A nozzle station must hold suction nozzles that correspond to the component types of the electronic components to be used in the production of a circuit board product. Here, by arranging a nozzle station storage device at production line 1 and automatically exchanging nozzle stations between the storage device and the electronic component mounters 10, productivity at production line 1 can be improved.

Also, the above waste tape collection container may be set below the upper section slots 12 of electronic component mounter 10 to function as a container in which waste tape generated from the feeders 20 supplying the electronic components is collected. This waste tape is, for example, a portion of carrier tape 22 from which electronic components have been removed cut to an appropriate length. The capacity of the waste tape collection container is limited. Therefore, it is effective to use exchanging robot 50 to, for example, maintain a favorable production state in which the amount of waste tape collected in the waste tape collection container is equal to or less than a specified amount.

In a case in which feeder 20 is a stick feeder, exchanging robot 50 may also be configured to perform supply of sticks and collection of empty sticks. Also, in a case in which feeder 20 is a bulk feeder, exchanging robot 50 may be configured to supply bulk components, supply component cases that store bulk components, and collect empty component cases. With such configurations too, it is possible to automatically supply and collect exchange elements, thus improving production efficiency at production line 1.

REFERENCE SIGNS LIST

1: production line; 2: floor surface;
10: electronic component mounter;
11: board conveyance device; 12: upper section slots; 13: lower section slot;
14: mounting head; 15: head moving device;
20: feeder (exchange element);
21: case; 22: carrier tape; 23: tape reel; 24: tape feeding mechanism; 25: rail; 26: feeder control device;
30: feeder storage device;
40: management device;
50: exchange robot (work apparatus);
51: exchanging device;
52: first rail;
52a: travel path; 52b: upper surface section; 52c: side surface section;
53: second rail; 53a: support section;
54: separation prevention guide;
60: moving device;
61: main body section; 61a: bracket;
62: first guide roller; 63: second guide roller;
64: third guide roller;
65: biasing mechanism; 65a: spring;
70: driving unit;
71: base plate; 71a: plate section; 71b: flange section
72: driving wheel; 73: driving motor;
74: transmission mechanism; 74a: pulley; 74b: endless belt;
80: position detecting device;
81: toothed belt; 82: pinion;

83: rotary encoder;
Bd: circuit board; R1: first range; R2: second range

The invention claimed is:

1. A work apparatus of a production line configured from multiple electronic component mounters lined up in a row in a conveyance direction of a circuit board, the work apparatus being configured to perform specified work to the circuit board with respect to each of the multiple electronic component mounters, the work apparatus comprising:
   a first rail provided on a front section of the multiple electronic component mounters, extending in the conveyance direction of the circuit board, and including a planar traveling path;
   an exchanging robot configured to perform collecting and supplying of an exchange element configured to be set on each of the multiple component mounters, the exchanging robot including a driving wheel that engages with the traveling path of the first rail via friction; and
   a moving device including a motor and a transmission, the moving device configured to move the exchanging robot along the first rail by driving the driving wheel with a driving output of the motor connected to the driving wheel via the transmission connected between the motor and driving wheel.

2. The work apparatus of the production line according to claim 1, wherein
   the traveling path is arranged in a vertical direction of the multiple electronic component mounters, and
   the moving device includes a spring configured to bias the driving wheel towards the traveling path such that engagement occurs due to friction.

3. The work apparatus of the production line according to claim 2, wherein
   the moving device includes a main body configured to hold the exchanging robot and hold a driving unit configured from the driving wheel, the motor, the transmission, and the spring, and
   the spring biases the driving wheel towards the traveling path by pushing the driving unit to the first rail with respect to the main body section.

4. The work apparatus of the production line according to claim 2, wherein
   the first rail includes an upper surface section and a side surface section that is perpendicular with respect to the upper surface section, and
   the moving device further includes
      a first guide roller rotatably engaged with the upper surface section of the first rail and configured to regulate movement downwards of the exchanging robot, and
      a second guide roller rotatably engaged with the side surface section of the first rail and configured to regulate movement of the exchanging robot in a horizontal direction that is perpendicular to the conveyance direction of the circuit board.

5. The work apparatus of the production line according to claim 4, further comprising:
   a second rail provided on the front section of the multiple electronic component mounters at a different position in the vertical direction than the first rail, the second rail extending in the conveyance direction of the circuit board, and formed with a support section in the vertical direction of the multiple electronic component mounters, wherein
   the moving device further includes a third guide roller that rolls along the support section of the second rail and maintains a posture of the exchanging robot.

6. The work apparatus of the production line according to claim 1, wherein
   the exchange element is a feeder configured to supply electronic components to be mounted on the circuit board, and
   the exchanging robot performs collecting and supplying of the feeders between each of the multiple electronic component mounters.

7. The work apparatus of the production line according to claim 6, wherein
   each of the multiple electronic component mounters include
      upper section slots configured to support a set feeder in a position to supply the electronic components, and
      lower section slots provided below the upper section slots and configured to resupply the set feeder,
   the first rail is provided on each of the multiple electronic component mounters between the upper section slots and the lower section slots in the vertical direction,
   the exchanging robot includes
      an upper section transfer section configured to transfer a feeder being exchanged between the upper section slots, and
      a lower section transfer section configured to transfer a feeder being exchanged between the lower section slots, and
   the driving wheel is provided between the upper section transfer section and the lower section transfer section in the vertical direction.

8. A production line comprising:
   multiple electronic component mounters lined up in a row in a conveyance direction of a circuit board, each of the multiple electronic component mounters including a first rail provided on a front section of the multiple electronic component mounters, extending in the conveyance direction of the circuit board, and including a planar traveling path;
   an exchanging robot configured to perform collecting and supplying of an exchange element set on each of the multiple electronic component mounters, the exchanging robot including a driving wheel that engages with the traveling path of the first rail via friction;
   a moving device including a motor and a transmission, the moving device configured to move the exchanging robot along the first rail by driving the driving wheel with a driving output of the motor connected to the driving wheel via the transmission connected between the motor and driving wheel.

* * * * *